(12) United States Patent
Lee

(10) Patent No.: US 10,790,659 B1
(45) Date of Patent: Sep. 29, 2020

(54) MULTI-PHASE VFD SYSTEM WITH FREQUENCY COMPENSATED GROUND FAULT PROTECTION

(71) Applicant: NEILSEN-KULJIAN, INC., San Jose, CA (US)

(72) Inventor: Tom Lik-Chung Lee, San Jose, CA (US)

(73) Assignee: NEILSEN-KULJIAN, INC., San Jose, CA (US)

( * ) Notice: Subject to any disclaimer, the term of this patent is extended or adjusted under 35 U.S.C. 154(b) by 0 days.

(21) Appl. No.: 16/913,781

(22) Filed: Jun. 26, 2020

(51) Int. Cl.
*H02H 7/08* (2006.01)
*G01R 31/52* (2020.01)
*H02H 1/00* (2006.01)

(52) U.S. Cl.
CPC .............. *H02H 7/08* (2013.01); *G01R 31/52* (2020.01); *H02H 1/0007* (2013.01); *H02H 1/0092* (2013.01)

(58) Field of Classification Search
CPC ...... H02H 7/08; H02H 1/0092; H02H 1/0007; G01R 31/52

USPC .......................................................... 361/48
See application file for complete search history.

(56) References Cited

U.S. PATENT DOCUMENTS

| 8,698,426 | B1* | 4/2014 | Nguyen | H02H 1/063 |
| | | | | 315/307 |
| 9,618,541 | B1* | 4/2017 | Nguyen | G01R 19/20 |
| 2013/0128396 | A1* | 5/2013 | Danesh | G01R 19/00 |
| | | | | 361/45 |
| 2019/0324075 | A1* | 10/2019 | Kinsella | H01F 38/30 |

* cited by examiner

*Primary Examiner* — Dharti H Patel
(74) *Attorney, Agent, or Firm* — TIPS Group

(57) ABSTRACT

A multi-phase VFD system with frequency compensated ground fault protection includes a variable frequency drive (VFD) power supply, a motor coupled to the VFD power supply by a plurality of power wires and a relay, an annular magnetic core provided with a sensor winding, where the plurality of power wires extend through the annular magnetic core, an analog signal conditioner, an analog-to-digital (A/D) converter, and a digital processor performing a Fast Fourier Transform (FFT) process on the received digital output of the A/D converter to provide frequency information which is used to develop a frequency equalized transfer function for calculating ground fault current.

20 Claims, 9 Drawing Sheets

MULTI-PHASE VFD SYSTEM WITH FREQUENCY COMPENSATED GROUND FAULT PROTECTION

BACKGROUND

In an electric power system, a fault or fault current is any abnormal electric current. For example, a short circuit is a fault in which current bypasses the normal load. In a "ground fault" or "earth fault", current flows into the earth. In a multi-phase (or "polyphase") system, such as a three-phase system, a fault may involve one or more phases and ground, or may occur only between phases. In such systems, a fault may affect all phases equally (a "symmetrical fault") or only some phases may be affected (an "asymmetrical fault"). Asymmetrical faults, in particular, present complexities in analysis and fault detection.

Ground fault sensing devices are commonly used to provide protection from potentially hazardous earth leakage current. They are typically used in circuits where the power supply has a constant frequency. However, they may not perform optimally if the supply frequency varies, such as with the use of the variable frequency drive (VFD) in industrial settings. The VFD is a method of controlling an AC motor by varying the voltage and frequency of the electric power supplied to the motor.

A VFD system, in general, has an operational frequency range from few hertz to several hundreds of hertz. Conventional VFD ground fault detectors utilize non-contact (or "contactless") transformer methodologies for sensing the magnetic fields developed around VFD power supply cables. However, the accuracy of such methodologies across the entire spectrum (e.g. 10 Hz to 400 Hz) is limited by the frequency response of the magnetic material of the non-contact transformers which provide magnetic flux coupling to the magnetic field of the VFD power supply cable. This is because the non-contact transform methodologies inherently cannot have a consistent flat (linear) frequency response due to the mutual inductance derivative effect and the bandwidth limit of the magnetic material that amplifies the permeability. The magnetic material is required to amplify the permeability to increase the sensitivity of the mutual inductance and therefore, to be able to detect relatively small quantity of ground fault current. As a result, a flat frequency response across the entire operating spectrum of prior art VFD systems for ground fault detection purposes remains elusive. Prior art VFD ground fault detectors therefore only guarantee accuracy in a rather narrow frequency range or reduce their accuracy specifications for the entire VFD frequency range.

These and other limitations of the prior art will become apparent to those of skill in the art upon a reading of the following descriptions and a study of the several figures of the drawing.

SUMMARY

An example ground fault detector includes a magnetic core provided with a sensor winding, an analog signal conditioner having an input coupled to the sensor winding, an analog-to-digital (A/D) converter having an analog input coupled to an output of the analog signal conditioner and having a digital output; and a digital processor receiving the digital output of the A/D converter and communicating with a non-transitory computer readable media storing program code segments for (a) performing a Fast Fourier Transform (FFT) process on the received digital output of the A/D converter to provide frequency information; (b) using the frequency information to develop a frequency equalized transfer function; (c) calculating a ground fault current using the frequency equalized transfer function; and (d) determining that a ground fault has occurred if the calculated ground fault current exceeds an acceptable ground leak current level. In an embodiment, calculating the ground fault current includes calculating an RMS value of ground fault current using an RMS computation integration period determined using the frequency information.

An example multi-phase VFD system with frequency compensated ground fault protection includes a variable frequency drive (VFD) power supply developing a plurality of power supply signals, a motor coupled to the plurality of power supply signals of the VFD power supply by a plurality of power wires and a relay, an annular magnetic core provided with a sensor winding, where the plurality of power wires extend through the annular magnetic core, an analog signal conditioner having an input coupled to the sensor winding, an analog-to-digital (A/D) converter having an analog input coupled to an output of the analog signal conditioner and having a digital output; and a digital processor receiving the digital output of the A/D converter and communicating with a non-transitory computer readable media storing program code segments for (a) performing a Fast Fourier Transform (FFT) process on the received digital output of the A/D converter to provide frequency information; (b) using the frequency information to develop a frequency equalized transfer function; (c) calculating a ground fault current using the frequency equalized transfer function; and (d) opening the relay if the calculated ground fault current exceeds an acceptable ground leak current level. As in the previous example, in an embodiment, calculating the ground fault current includes calculating an RMS value of ground fault current using an RMS computation integration period determined using the frequency information.

An example method for detecting ground faults in a multi-phase VFD system includes passing a plurality of power wires of a multi-phase VFD system through an annular magnetic core provided with a sensor winding to provide a sensor signal, digitizing the sensor signal, and processing the sensor signal in a digital processor by (a) performing a Fast Fourier Transform (FFT) process on the received digital output of the A/D converter to provide frequency information; (b) using the frequency information to develop a frequency equalized transfer function; (c) calculating a ground fault current using the frequency equalized transfer function; and (d) determining that a ground fault has occurred if the calculated ground fault current exceeds an acceptable ground leak current level. In an embodiment, the sensor signal is conditioned with an equalization filter and a low pass filter before it is digitized.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION

Figure 1:
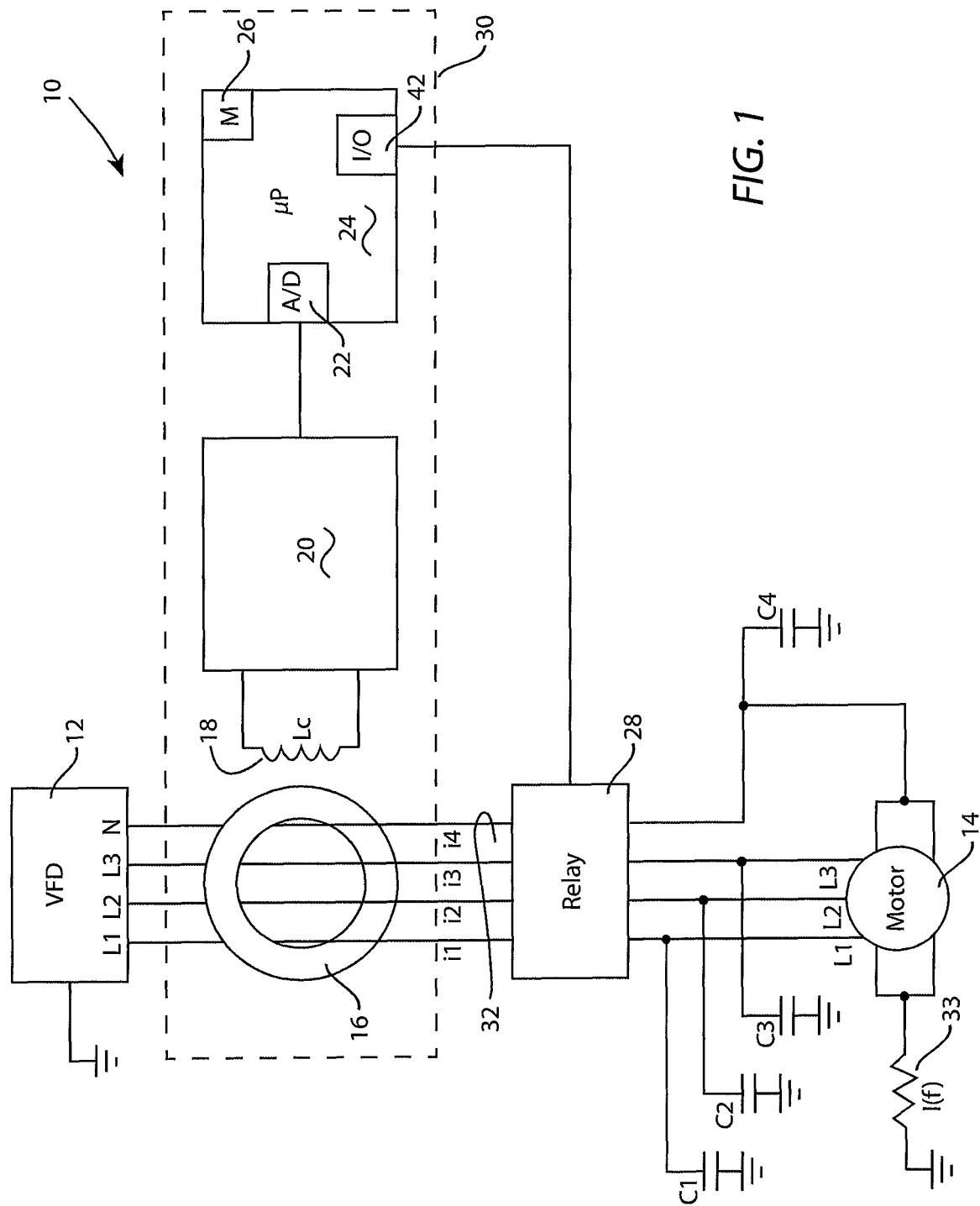
FIG. 1 is a block diagram of a multi-phase VFD system with frequency compensated ground fault protection.

In FIG. 1, a multi-phase VFD system 10 with frequency compensated ground fault protection includes a variable frequency drive (VFD) power supply 12, a motor 14, an annular magnetic core 16 provided with a sensor winding 18, an analog signal conditioner 20, an analog-to-digital (A/D) converter 22, a digital processor 24, non-transitory computer readable media (memory) 26 and a relay 28. A ground fault detector 30 portion of multi-phase VFD system 10 includes the annular magnetic core 16 with sensor winding 18, the analog signal conditioner, the A/D converter, the digital processor 24 and the memory 26.

The VFD power supply 12, in this example, is a 3-phase power supply generating three power supply signals labelled L1, L2 and L3. VFD power supplies of various types are commercially available, but typically operate by rectifying an A.C. power source to produce D.C. power, and then employ either high-power Insulated Gate Bipolar Transistor (IGBT) or FET Field Effect Transistor (FET) transistors to use Pulse Width Modulation (PWM) bi-directional current control switching to emulate sinusoidal waveform content on each of the L1, L2, and L3 power wires. In addition, each power wire sinusoidal will have a mutually 120-degree phase offset relationship with each other. There may be a neutral wire N for returning currents depending on the particular motor configurations. Collectively, the power wires L1, L2 and L3 and the neutral wire N can be bundled or formed as a cable 32 which pass through the annular magnetic core 16. By "wire", it is meant herein a conductive wire, typically made from copper or a copper alloy, covered with an insulating material. By "bundle" it is meant that individual wires are bundled together, and by "cable" it is meant that individual wires are encased in a common sheathing. Both the motor winding inductance and motor mass angular inertia will act like a low pass filter to filter out each power wire's PWM high frequency carrier signal. As a result, an effective 3-phase sinusoidal current waveform is produced for driving the motor 14.

The motor 14, in this non-limiting example, is a 3-phase motor powered by power wires L1, L2 and L3. The neutral wire N is coupled to the enclosure of the motor. Parasitic capacitances C1, C2 and C3 couple power wires L1, L2 and L3 to ground, and a ground path resistance 33 represents a potential ground fault current I(f).

In the case of an insulation failure anywhere along each of the L1, L2, L3 power wire and/or motor internal windings, a current "leak" through the ground path is materialized. Refer to FIG. 1, the current I(f) depict an example of a leak. The leak could go through a personnel's body that creating a ground path. Such ground path through personnel body can be hazardous. As will be discussed in greater detail subsequently, a relay 28 can be inserted in-line with cable 32. When the system is operating normally, the relay 28 will be closed and power will be provided to the motor 14 by the VFD power supply 12. However, when the ground fault detector 30 detects a ground fault current I(f), the relay 28 can be opened to remove power from the motor 14 to reduce the chance for injury and/or equipment damage.

As noted previously, due to PWM switching signals used in the VFD power supply having high frequency content, there will be capacitive coupling leakage of the motor drive signal to the motor housing ground. Since there are long magnetic wires winding inside motor to produce magnetic field, the long magnetic wire winding will provide sufficient effective capacitive surface area coupling with the motor housing. Hence, during normal operations, a certain amount of inherent ground leak current is detectable. Therefore, a ground fault should only be determined if the calculated ground fault current exceed an acceptable ground leak current level. That is, the calculation must be precise enough to differentiate the abnormal ground leakage depicted by I(f) on top of the normal capacitive leakage depicted by C1, C2, C3 and C4 in FIG. 1. As a result, the ground fault detection apparatus preferably has constant gain across the operating frequency range (e.g. 10 Hz to 400 Hz) of the multi-phase VFD system. An example methodology for accomplishing this goal will now be described.

With continuing reference to FIG. 1, example VFD 3-phase power supply 12 generates power through wires L1, L2, and L3 with an auxiliary neutral power wire N. These four wires carry currents of i1, i2, i3, and i4. All four of these wires extend through the magnetic core 16 with a toroid style winding 18 (Lc) on the core. The Lc is stimulated a signal by the net sum current of i1, i2, i3, and i4, in case, if the net sum current is not equal to zero. Such signal from the Lc will feed into a signal conditioner 20, which equalize the frequency response of the simulated signal Lc. Furthermore, the signal conditioner 12 will low pass filter out the high frequency switching PWM carrier signal from the VFD power generating system.

Let the primary net stimulus current through the core be $$i = i_1 + i_2 + i_3 + i_4 \qquad \text{eq(1)}$$

In the case eq(1) if i≠0, then there is a net stimulus current i through the core 16. As a result, due to mutual inductance, there will be an induced voltage generated across Lc winding on the toroid 16. The voltage induced and generated on Lc is $$E = M * \left(\frac{di}{dt}\right) \qquad \text{eq (2)}$$

where M is mutual inductance.

As you can see the induced voltage on Lc is proportional to the derivative of i and the transfer function from i to E is $$E(s) = s * M * i \qquad \text{eq(3)}$$

where s is the Laplace operator.

To get back the original i, we need to integrate E eq(2)

$$\int E = \int M * \left(\frac{di}{dt}\right) = M * \int \frac{di}{dt} = M * i \qquad \text{eq (4)}$$

Therefore, the transfer function from eq(4) will become $$\frac{1}{s}E(s) = \frac{1}{s} * s * M * i = M * i \qquad \text{eq (5)}$$

Hence, by integrating the induced voltage from Lc will get a proportional information of i from eq(4) and eq(5).

Figure 2:
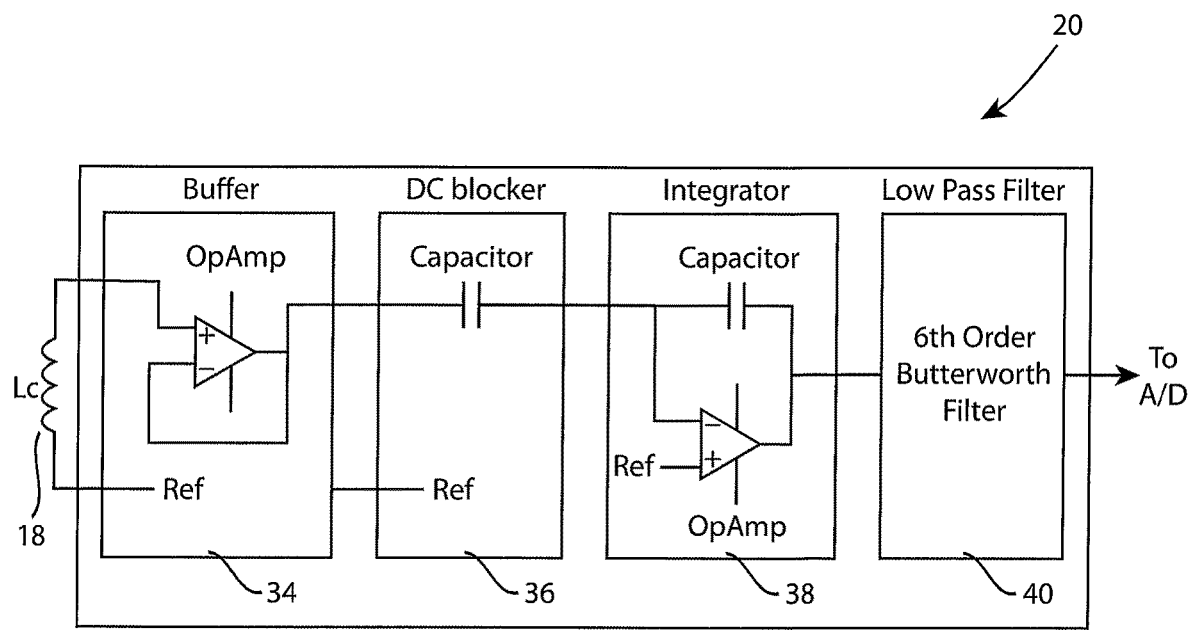
FIG. 2 is a block diagram of an example signal conditioner of FIG. 1.

In FIG. 2, example signal conditioner 20 includes a buffer 34, a direct current (D.C.) blocker 36, an integrator 38 and a low pass filter 40. In this non-limiting example, the buffer 34 comprises a unity gain operational amplifier (OpAmp), the D.C. blocker comprises a capacitor, the integrator comprises an OpAmp with negative capacitive feedback, and the low pass filter comprises a $6^{th}$ order Butterworth filter. Since the integrator 38 has a tremendous gain on any small D.C. offset value, there is a capacitive coupling by the D.C. blocker 36 before the integrator 38 to block any DC offset residues. Furthermore, the signal conditioner 20 embodiment contains a $6^{th}$ order Butterworth low pass filter to cut off unwanted high frequency noise that might have been coupled into the system. Since the output of signal conditioner 20 will be digitized by A/D converter 22 and input to the processor (microprocessor) 24, any frequency higher than the Nyquist frequency will be filtered out by the low pass filter 40 of signal conditioner 20.

The conditioned signal from signal conditioner 20 will be fed into a microprocessor 24 A/D converter 22 input port of the microprocessor 24. Alternatively, the A/D converter 22 can be separate from the microprocessor 24. The microprocessor 24 will sample such signal in a regular interval at a particular frequency. For example, a regular interval of 1 msec at 1000 Hz is implemented. Hence, it will have a 500 Hz usable spectrum of signal content. A 500 Hz usable spectrum is adequate for most typical VFD system which operates up to 400 Hz.

In turn, the microprocessor 24 can have an output control of relay 28 via an input/output (I/O) port 42. In case of a ground fault current I(f) is present, as represented by ground path resistance 33, the microprocessor 24 can actuate the relay 28 to cut off the power supplies to the motor 14 to prevent either personnel hazard or damage to the motor. The embodiment allows a normal operating ground leak current (referred to herein as "an acceptable ground leak current level") through C1, C2, C3, and/or C4 can be set by the user to differentiate the addition of ground fault current I(f). Furthermore, the microprocessor 24 can determine the operating frequency of the VFD power supply so that it can further adjust the gain of the Lc signal in such a way that a more accurate detection of I(f) can be achieved.

Furthermore, the microprocessor 24 calculates the ground fault current I(f) by its RMS (Root Mean Square) value. RMS value is by way of averaging the square root the energy of the I(f) signal over a short period of time. By monitoring the RMS value of I(f), it will eliminate any unwanted nuisance tripe due to power supply system spikes. Since the VFD has variable frequency power signal, the I(f) will also vary with power signal frequency. At low frequency, the signal period is longer and at high frequency, the signal period is shorter. The RMS computation integration period will need to be adjusted according to the I(f) signal frequency. Therefore, the microprocessor 24 has adaptive algorithm to the I(f) frequency to adjust its RMS integration period accordingly.

It will therefore be appreciated that a multi-phase VFD system with frequency compensated ground fault protection is provided that includes a front-end equalization low pass filter that compensates for the derivative effect of the current transformer mutual inductance transfer function and provides a low pass filter to limit the bandwidth of unwanted noise spectrum. The FFT routines in the microcontroller provide frequency information of the signal that can enable microcontroller to do additional equalization adjustment in such a way that a true flat transfer function in the operating frequency range of the VFD system can be emulated. Furthermore, the front-end equalization low pass filter can filter (low pass) out the VFD PWM (Pulse Width Modulation) carrier signal (switching) frequency. Since true RMS calculation require integrating the signal multiple cycles and since the cycle period is different at different frequency signal, the microcontroller can adjust the integration period for the RMS calculation adaptively according to the signal frequency to obtain a more accurate RMS value with the minimum possible time duration. Furthermore, the microcontroller can control a contact relay to interrupt VFD power supply in case a ground fault is detected.

Figure 3:
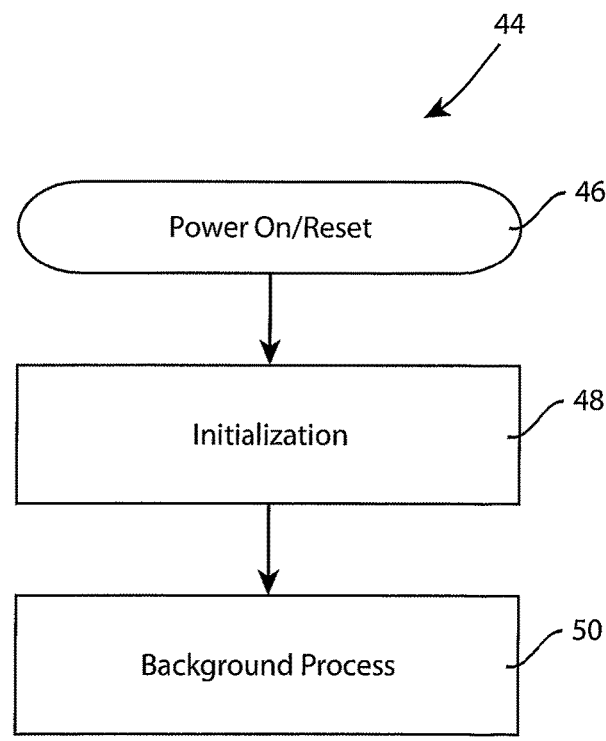
FIG. 3 is a flow diagram of an example process implemented by the microcontroller of FIG. 1.

FIG. 3 is a flow diagram of an example process 44 implemented by the microprocessor 24 of FIG. 1. Process 44 begins with a power-on reset of the microprocessor 24, followed by an initialization step 48, before entering background processes 50. Process 44 remains in the background process 50 until power is removed from the microprocessor 24, with the exception of the handling of interrupt routines, as will be discussed subsequently.

Figure 4:
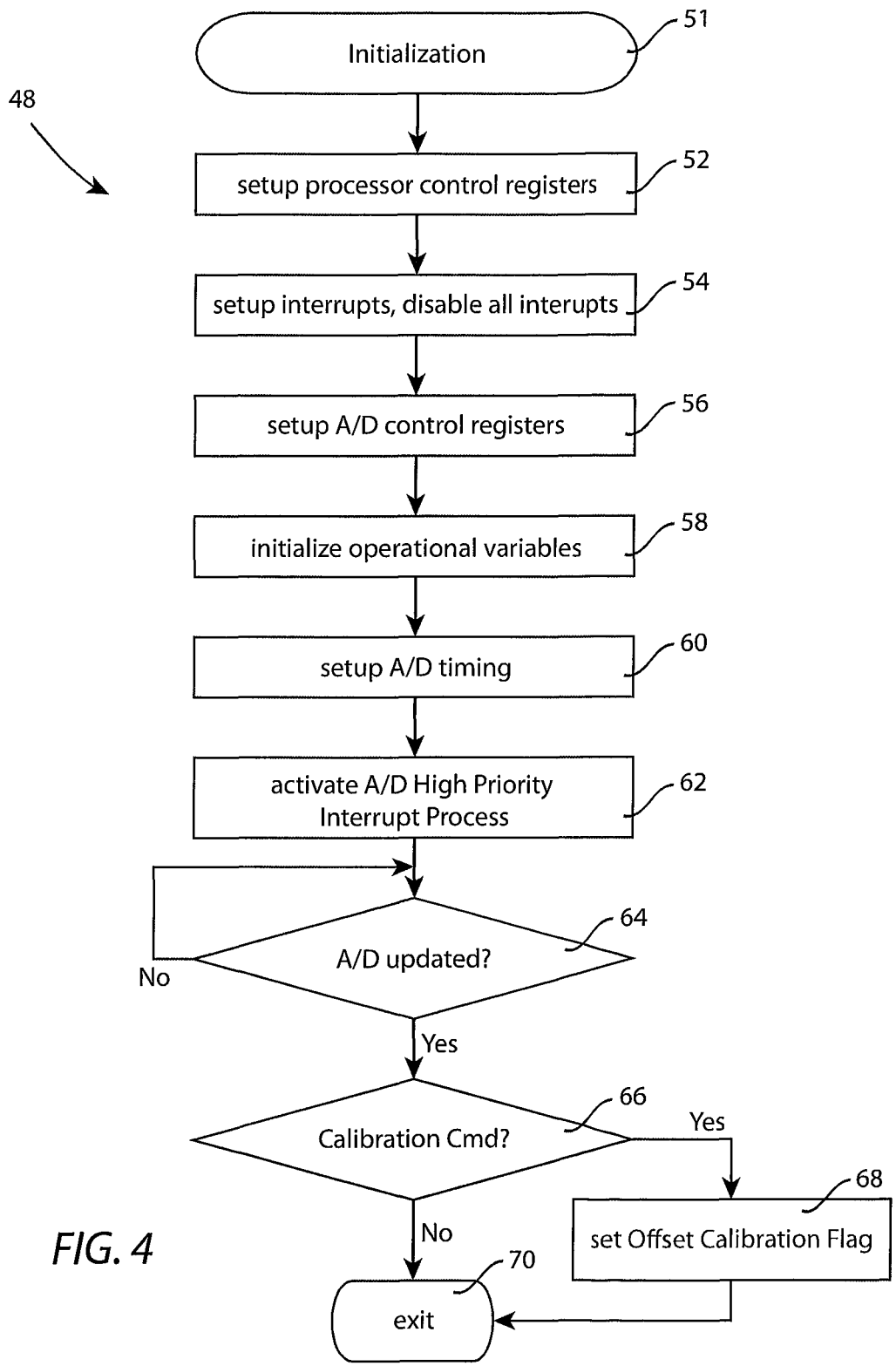
FIG. 4 is a flow diagram of an example initialization process of FIG. 3.

FIG. 4 is a flow diagram of an example initialization process 48 of FIG. 3. Process 48 begins at 51 and, in an operation 52, the processor control registers are setup. Next, in an operation 54, the interrupts are setup, and all interrupts are disabled. Next, in an operation 56, the A/D control registers are setup and, in an operation 58, operational variables are initialized. Then, in an operation 60, A/D timing is setup and, in an operation 62, an A/D high priority interrupt processes is activated. In a decision operation 64 it is determined if the A/D is updated. If not, process control remains with operation 64 until the A/D is updated. When it is updated, a decision operation 66 determines if there is a calibration command. If so, an offset calibration flag is set in an operation 68. The initialization process 48 is then complete and the process is exited at operation 70.

Figure 5:
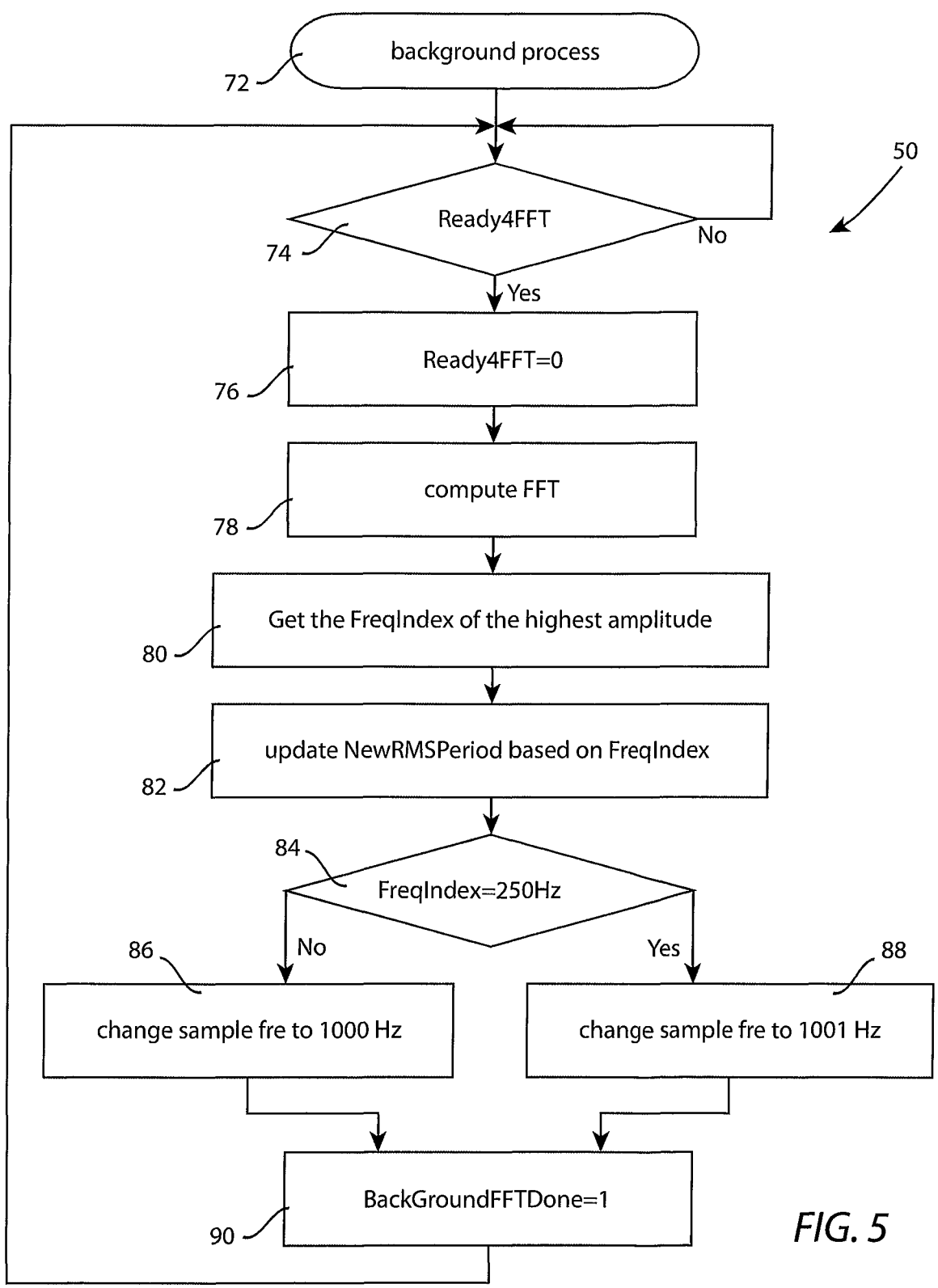
FIG. 5 is a flow diagram of an example background process of FIG. 3.

FIG. 5 is a flow diagram of an example background process 50 of FIG. 3. Background process 50 begins at 72 and, in a decision step 74, it is determined if the process is ready to perform a Fast Fourier Transform (FFT). If not, it idles until it is ready to perform an FFT or until operation 136 (see FIG. 6B) sets the Ready4FFT flag to "1" (e.g. "yes" or "true"). If it is ready to perform an FFT, an operation 76 sets a flag Ready4FFT=0 to indicate it is currently in an FFT process, and the FFT is computed in an operation 78. An operation 80 gets the frequency index of the highest amplitude of the FFT and updates the variable NewRMSPeriod based upon the FreqIndex in an operation 82. Operations 84-88 address a relatively minor issue with a beating effect that is preferably avoided during calibrations. Finally, in an operation 90, a flag BackGroundFFTDone=1 is set, and process control return to operation 74.

The beating effect addressed by operations 84-88, in this non-limiting example, is because the process is sampling at 1000 Hz, where 500 Hz is exactly one half of the sampling rate, and 250 Hz is one quarter of the sampling rate. Therefore, in this example with a 1000 Hz sampling rate, there are only two samples per 500 Hz period and 4 samples per 250 Hz period. If the calibration signal provided to the microprocessor 24 was an ideal sinusoid free of harmonic distortion, then computing an RMS value with so few samples would not be an issue. However, even with a theoretically perfect sinusoidal signal through core 16, after the signal magnetically coupled through Lc, processed by signal conditioner 20, and undergoes an analog-to-digital conversion, the inevitable result is that a less-than-perfect harmonic signal is presented to microprocessor 24. Operations 84-88 address this issue by implementing a limited spread-spectrum process to slightly offset the sampling frequency when it is at 250 Hz so that locking at the same phase locations of the 250 Hz signal can be avoided and so that an average over different locations of the 250 Hz signal is obtained. In this example, 500 Hz is outside of the operating spectrum, and can be ignored with respect to this issue.

Figure 6A:
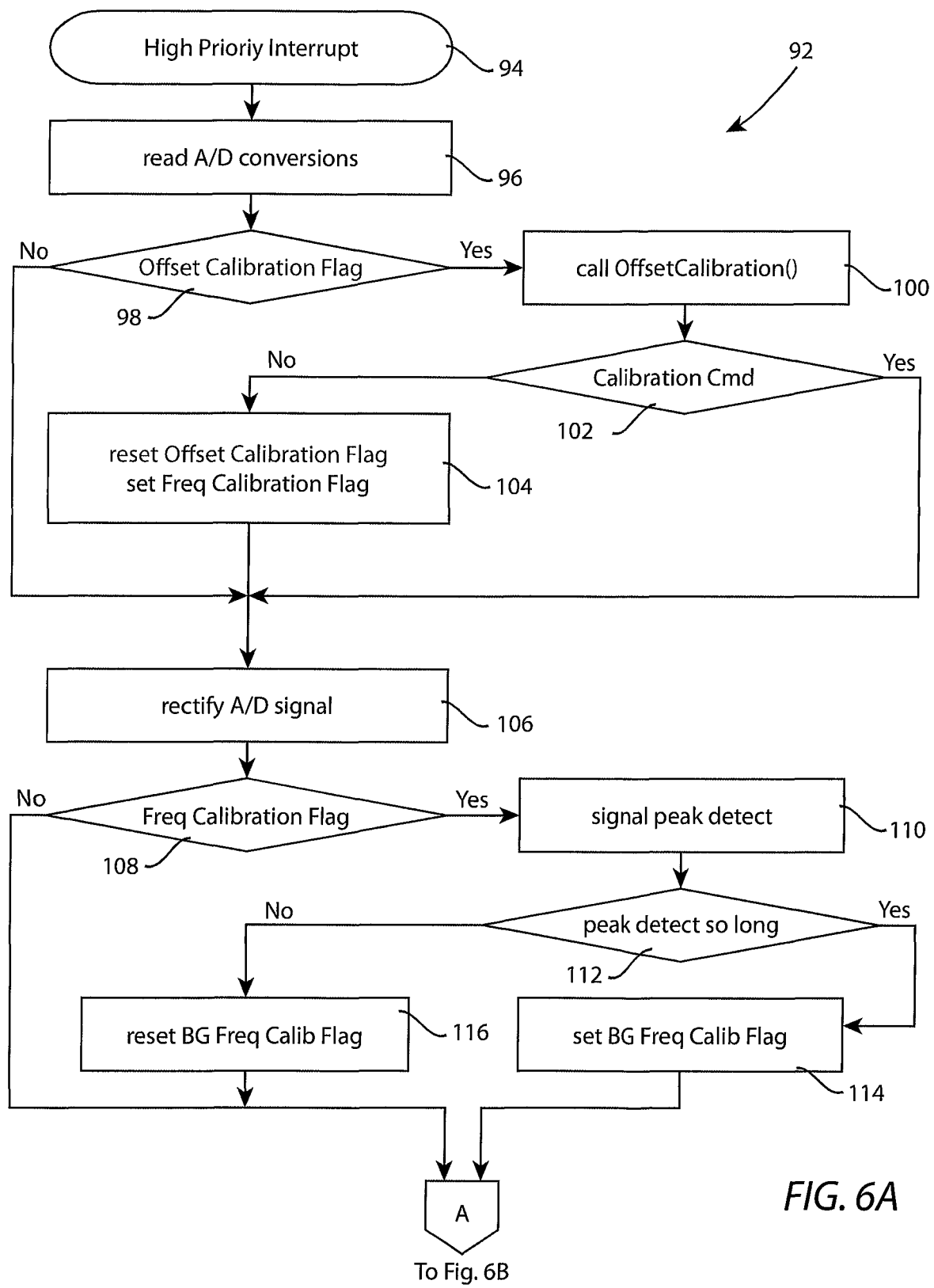
FIGS. 6A-6C comprise a flow diagram of an example high priority interrupt process.
Figure 6B:
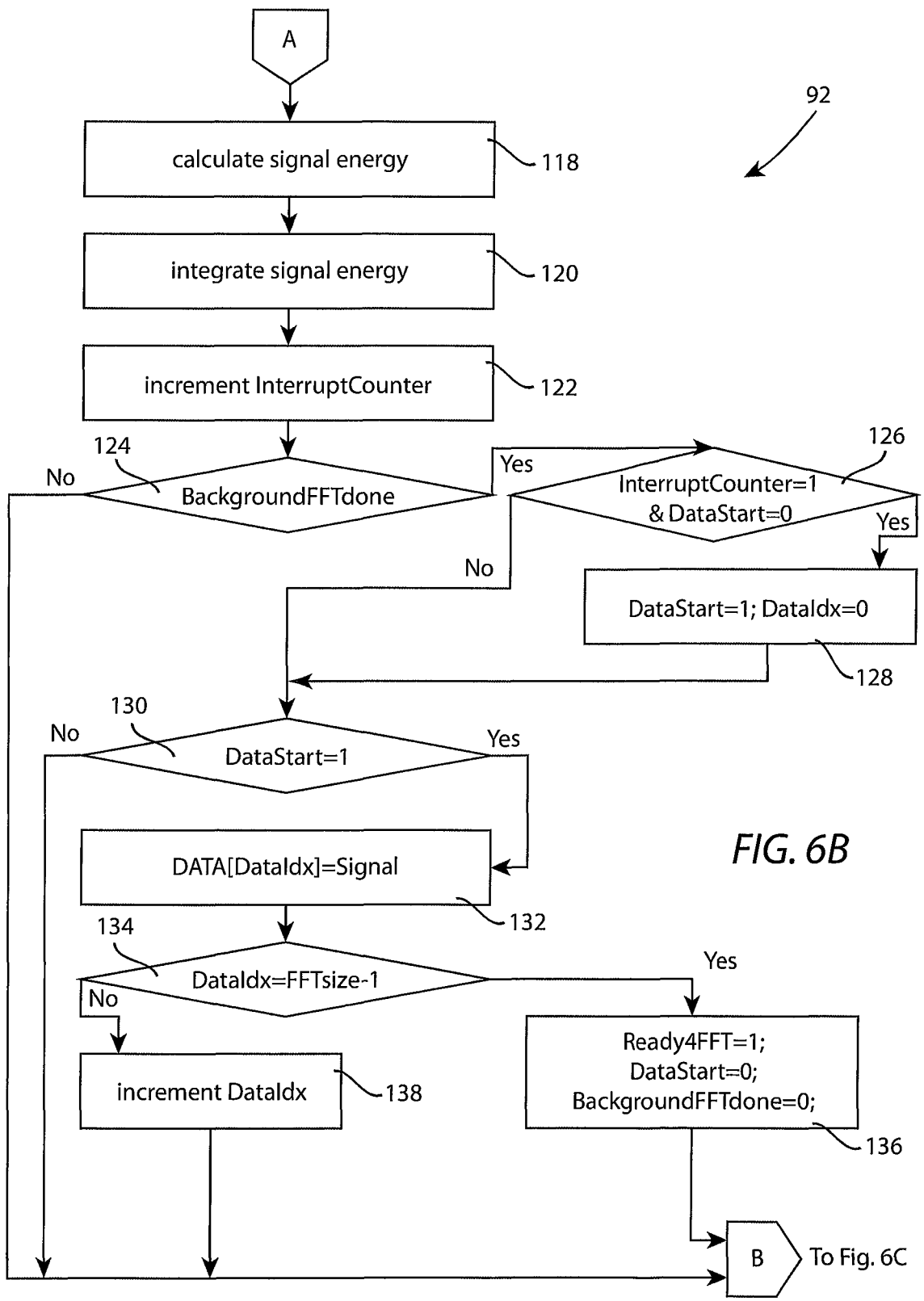
Figure 6C:
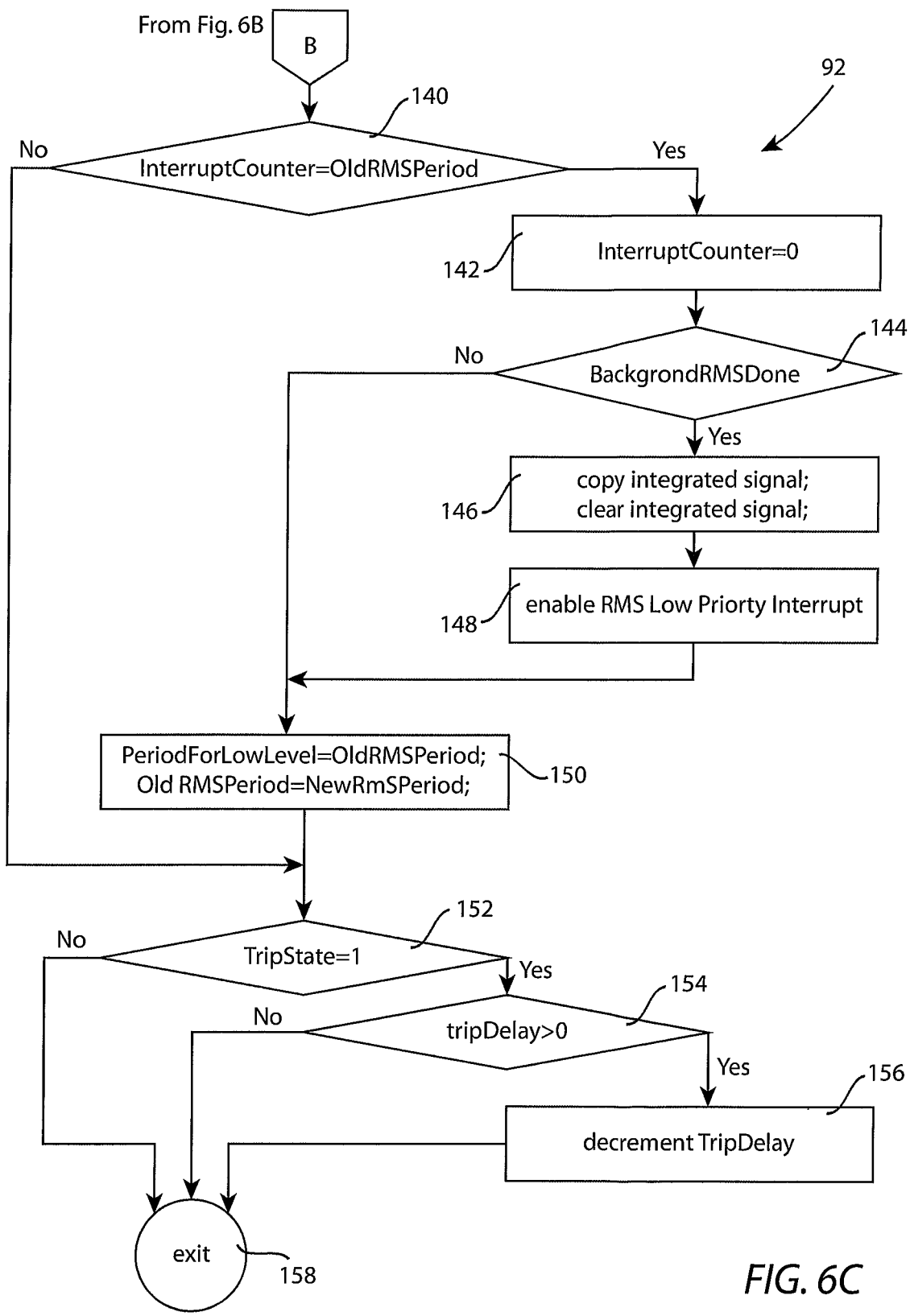

FIGS. 6A-6C comprise a flow diagram of an example high priority interrupt process 92 implemented on the microprocessor 24 of FIG. 1 after the receipt of a high priority interrupt signal. A high priority interrupt signal 94 will pause whatever process (e.g. background process 72) is currently being implemented by the microprocessor 24 to service the high priority interrupt process 92. In this non-limiting example, high priority interrupt process 92 is initiated by a high priority interrupt signal 94 generated at regular intervals, e.g. every millisecond (1000 Hz), based upon a system clock (not shown). With reference to FIGS. 6A-6C process 92, after being initiated by high priority interrupt 94, includes the following operations:

a) reading four channels of A/D conversions, namely, signal through core, calibration command, range command, delay command (operation 96);

b) determining if the Offset Calibration Flag is set and reacting accordingly. It should be noted that the Offset Calibration Flag is preferably set by the power on initialization 48 at operation 68. Once set, as determined by operation 98) the OffsetCalibration( ) process 100 can be called. Operation 102 determines if Calibration Cmd changes from offset to frequency calibration. Until the Calibration Cmd changes, operation 104 will reset Offset Calibration Flag and set Freq Calibration Flag (operations 98-104);

c) rectifying the analog-to-digital (A/D) signal in an operation 106;

d) determining if the frequency calibration flag is set and reacting accordingly (operations 108-116);

e) keeping track of two sets of data records, where the first set of data records include a 256 datapoint array to fill for the Background FFT routine, and where the second set of data records include either 32, 64, or 128 data points to integrate depending upon the signal frequency (operations 118-146);

f) activating an "RMS Low Priority Interrupt" and synchronizing whenever there are either 32, 64, or 128 data points being integrated (operation 148);

g) informing the Background FFT process and synchronizing whenever there are 256 data points being collected so that the Background FFT can begin computing with the data when it is ready; and h) monitoring and clocking the delay timer after updating variables in an operation 150 to ensure a regular 1 ms interval time (operations 152-158) before exiting the process 92 at 158.

With particular reference to FIGS. 4 and 6A, operation 98 determines if Offset Calibration Flag is set. (The Offset Calibration Flag is preferably set by the power on initialization 48 at operation 68.) Once set, the OffsetCalibration( ) process 100 can be called. Operation 102 determines if Calibration Cmd changes from offset to frequency calibration. Until the Calibration Cmd changes, operation 104 will reset Offset Calibration Flag and set Freq Calibration Flag after signal is rectified at operation 106, operation 108 determines if Freq Calibration Flag is set. If set, then there will be signal qualification operation of 110, 112, 114, and 116. Once calibration signal is "good" (e.g. peak detect so long 112 is true), the process 92 will set the BG Freq Calib Flag by operation 114. Otherwise, when signal conditions are not good enough (e.g. peak detect so long 112 is false), the process 92 will reset the BG Freq Calib Flag. The BG Freq Calib Flag, in this example, is to control the Low Priority Interrupt process 168 as to whether to store the good calibration signal or not.

With additional reference to FIGS. 6B and 6C, operation 96 acquires the A/D signal so that operation 118 can calculate signal energy and so that operation 120 can integrate the signal energy. Operation 122 increments the variable interruptCounter until an integration period determined by operation 140 is completed and, thereafter, will be reset to zero (0) by operation 142. Operation 124 determines when the BackgroundFFT process has completed its task. Thereafter, operation 126 will synchronize a first FFT data record with a first sample of the RMS period cycle and start storing data in memory until the variable FFTsize is determined. Thereafter, operation 136 will reset the variable DataStart to zero. (0) and then set the Ready4FFT flag to trigger the background process 50 (see FIG. 5).

With particular reference to FIG. 6C, the when the InterruptCounter variable is equal to the RMS integration period set by operation 150 in an operation 140, the InterruptCounter is reset to zero (0) in an operation 142 and the integrated data for RMS Low Priority Interrupt to process is copied and the process is activated. Since a High Priority Interrupt is not interrupted by any lower priority processes, the high priority interrupt is preferably used to count all timing functions. One of the timing functions is to delay the trip by a customer's set point. Hence, operations 152, 154, and 156 effectuate a count down a TripDelay timer.

Figure 7A:
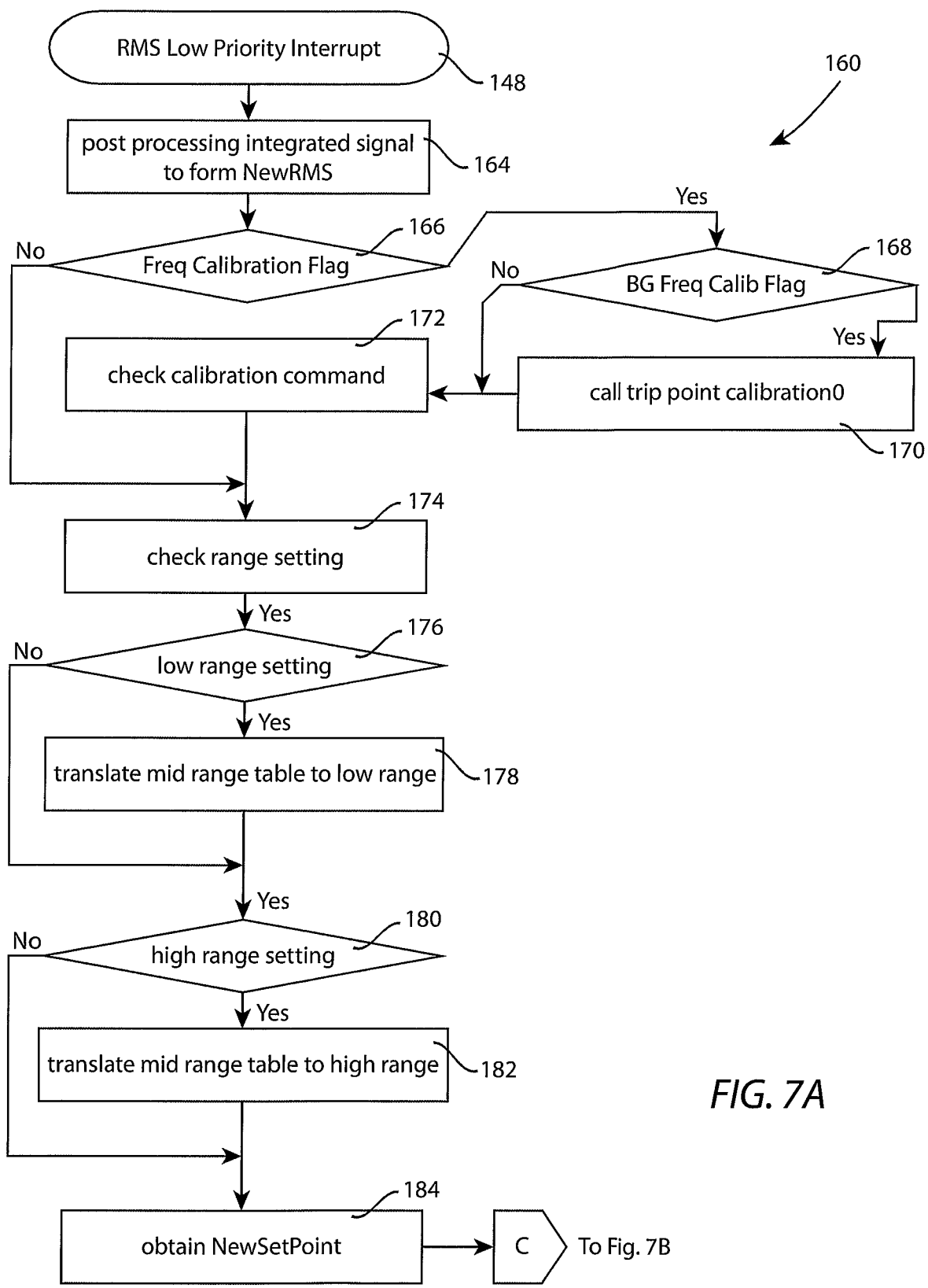
FIGS. 7A-7B comprise a flow diagram of an example RMS Low Priority Interrupt process.
Figure 7B:
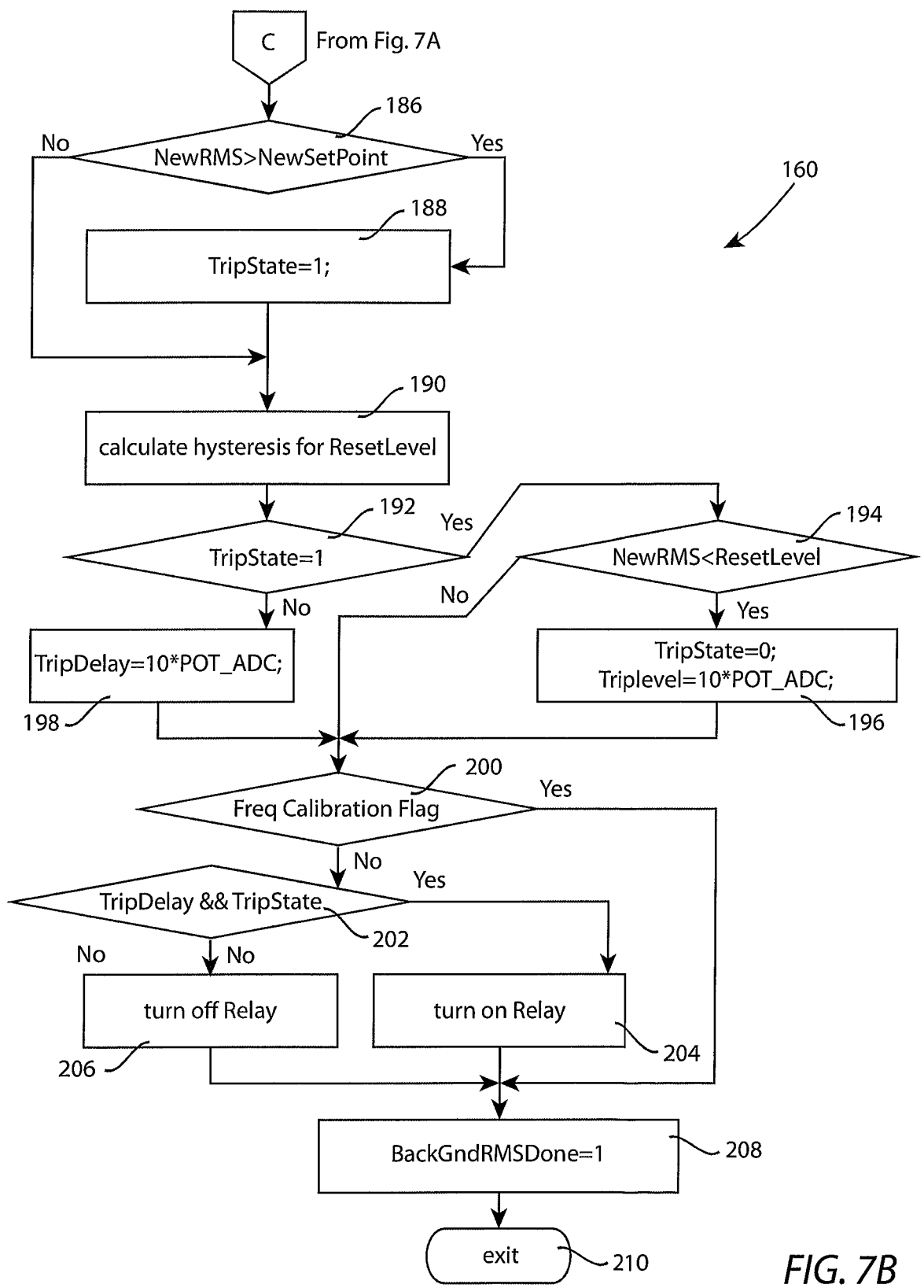

FIGS. 7A and 7B comprise a flow diagram of an example RMS Low Priority Interrupt process 160 initiated by a low priority interrupt signal being generated by the enable RMS Low Priority Interrupt operation 148 of FIG. 6C. A low priority interrupt will interrupt any process operating on microprocessor 24 other than a high priority interrupt. With reference to FIGS. 7A and 7B, low priority interrupt process 160, after being initiated by low priority interrupt signal by operation 148, includes:

1) calculating a NewRMS value based on the High Priority Interrupt integrated value (operation 164);

2) calling the calibration function if indicated by High Priority Interrupt (operations 166-172);

3) checking the range command value to set trip level (operations 174-184);

4) comparing the NewRMS with the trip level and set trip state and calculate hysteresis for ResetLevel (operations 186-196);

5) calculate the TripDelay (operation 198) based on A/D conversion value of customer setting, where the TripDelay is used for operations 154 and 156 (see FIG. 6C) to decrement the count; and 6) turning on the relay (operation 204) when the trip state says so and trip delay timer has expired (operation 202) and turning off the relay (operation 206) otherwise (operations 200-206), after which operation 208 sets a flag to indicate completion and the low priority interrupt process 160 exits at operation 210.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A ground fault detector comprising:
   a magnetic core provided with a sensor winding;
   an analog signal conditioner having an input coupled to the sensor winding;
   an analog-to-digital (A/D) converter having an analog input coupled to an output of the analog signal conditioner and having a digital output; and
   a digital processor receiving the digital output of the A/D converter and communicating with a non-transitory computer readable media storing program code segments for
      (a) performing a Fast Fourier Transform (FFT) process on the received digital output of the A/D converter to provide frequency information;
      (b) using the frequency information to develop a frequency equalized transfer function;
      (c) calculating a ground fault current using the frequency equalized transfer function; and
      (d) determining that a ground fault has occurred if the calculated ground fault current exceeds an acceptable ground leak current level.

2. A ground fault detector as recited in claim 1 wherein calculating a ground fault current comprises calculating a Root Mean Square (RMS) value of ground fault current values.

3. A ground fault detector as recited in claim 2 wherein the RMS calculation uses an RMS computation integration period.

4. A ground fault detector as recited in claim 3 wherein the RMS computation integration period is determined using the frequency information.

5. A ground fault detector as recited in claim 1 wherein the analog signal conditioner includes an equalization filter.

6. A ground fault detector as recited in claim 5 wherein the equalization filter includes an integrator having an input coupled to the input of the analog signal conditioner.

7. A ground fault detector as recited in claim 6 wherein the integrator is coupled to the input of the analog signal conditioner by a series connection of a buffer and a direct current (D.C.) blocker.

8. A ground fault detector as recited in claim 5 further comprising a low pass filter (LPF) having an input coupled to an output of the integrator and an output coupled to the output of the analog signal conditioner.

9. A multi-phase VFD system with frequency compensated ground fault protection comprising:
   a variable frequency drive (VFD) power supply developing a plurality of power supply signals;
   a motor coupled to the plurality of power supply signals of the VFD power supply by a plurality of power wires and a relay;
   an annular magnetic core provided with a sensor winding, where the plurality of power wires extend through the annular magnetic core;
   an analog signal conditioner having an input coupled to the sensor winding;
   an analog-to-digital (A/D) converter having an analog input coupled to an output of the analog signal conditioner and having a digital output; and
   a digital processor receiving the digital output of the A/D converter and communicating with a non-transitory computer readable media storing program code segments for
      (a) performing a Fast Fourier Transform (FFT) process on the received digital output of the A/D converter to provide frequency information;
      (b) using the frequency information to develop a frequency equalized transfer function;
      (c) calculating a ground fault current using the frequency equalized transfer function; and
      (d) opening the relay if the calculated ground fault current exceeds an acceptable ground leak current level.

10. A multi-phase VFD system with frequency compensated ground fault protection as recited in claim 9 wherein calculating a ground fault current comprises calculating a Root Mean Square (RMS) value of ground fault current values over a period of time.

11. A multi-phase VFD system with frequency compensated ground fault protection as recited in claim 10 wherein the RMS calculation uses an RMS computation integration period.

12. A multi-phase VFD system with frequency compensated ground fault protection as recited in claim 11 wherein the RMS computation integration period is determined using the frequency information.

13. A multi-phase VFD system with frequency compensated ground fault protection as recited in claim 9 wherein the analog signal conditioner includes an equalization filter.

14. A multi-phase VFD system with frequency compensated ground fault protection as recited in claim 13 wherein the equalization filter includes an integrator having an input coupled to the input of the analog signal conditioner.

15. A multi-phase VFD system with frequency compensated ground fault protection as recited in claim 14 wherein the integrator is coupled to the input of the analog signal conditioner by a series connection of a buffer and a direct current (D.C.) blocker.

16. A multi-phase VFD system with frequency compensated ground fault protection as recited in claim 15 further comprising a low pass filter (LPF) having an input coupled to an output of the integrator and an output coupled to the output of the analog signal conditioner.

17. A method for detecting ground faults in a multi-phase VFD system comprising:
   passing a plurality of power wires of a multi-phase VFD system through an annular magnetic core provided with a sensor winding to provide a sensor signal;
   digitizing the sensor signal; and
   processing the sensor signal in a digital processor by
      (a) performing a Fast Fourier Transform (FFT) process on the received digital output of the A/D converter to provide frequency information;
      (b) using the frequency information to develop a frequency equalized transfer function;
      (c) calculating a ground fault current using the frequency equalized transfer function; and (d) determining that a ground fault has occurred if the calculated ground fault current exceeds an acceptable ground leak current level.

18. A method for detecting ground faults in a multi-phase VFD system as recited in claim 17 wherein calculating a ground fault current comprises calculating a Root Mean Square (RMS) value of ground fault current values.

19. A method for detecting ground faults in a multi-phase VFD system as recited in claim 18 wherein an RMS computation integration period is determined using the frequency information.

20. A method for detecting ground faults in a multi-phase VFD system as recited in claim 17 further comprising conditioning the sensor signal with an equalization filter and a low pass filter before digitizing the sensor signal.

* * * * *